(12) United States Patent
Yu et al.

(10) Patent No.: US 9,153,693 B2
(45) Date of Patent: Oct. 6, 2015

(54) FINFET GATE WITH INSULATED VIAS AND METHOD OF MAKING SAME

(71) Applicant: GLOBALFOUNDRIES, Inc., Grand Cayman (KY)

(72) Inventors: Hong Yu, Rexford, NY (US); Wang Zheng, Ballston Lake, NY (US); Huang Liu, Mechanicville, NY (US); Yongsik Moon, Loudonville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 73 days.

(21) Appl. No.: 13/917,019

(22) Filed: Jun. 13, 2013

(65) Prior Publication Data

US 2014/0367803 A1    Dec. 18, 2014

(51) Int. Cl.
*H01L 29/66* (2006.01)
*H01L 29/78* (2006.01)
*H01L 21/28* (2006.01)
*H01L 29/49* (2006.01)

(52) U.S. Cl.
CPC ........ *H01L 29/785* (2013.01); *H01L 21/28008* (2013.01); *H01L 29/495* (2013.01); *H01L 29/66545* (2013.01); *H01L 29/66795* (2013.01)

(58) Field of Classification Search
CPC ............ H01L 29/66795; H01L 29/785; H01L 29/66545; H01L 21/76224; H01L 21/823431; H01L 21/823821; H01L 21/845; H01L 21/76229; H01L 27/0924; H01L 29/6681; H01L 21/762
See application file for complete search history.

(56) References Cited

U.S. PATENT DOCUMENTS

| | | | |
|---|---|---|---|
| 2005/0051825 A1* | 3/2005 | Fujiwara et al. | 257/308 |
| 2013/0200468 A1* | 8/2013 | Cai et al. | 257/401 |
| 2014/0264604 A1* | 9/2014 | Tsai et al. | 257/347 |

\* cited by examiner

*Primary Examiner* — Minh-Loan Tran
*Assistant Examiner* — Leslie Pilar Cruz
(74) *Attorney, Agent, or Firm* — Wayne F. Reinke, Esq.; Heslin Rothenberg Farley & Mesiti P.C.

(57) ABSTRACT

An intermediate semiconductor structure of a FinFET device in fabrication includes a substrate, a plurality of fin structures coupled to the substrate and a dummy gate disposed perpendicularly over the fin structures. A portion of the dummy gate is removed between the fin structures to create one or more vias and the one or more vias are filled with a dielectric. The dummy gate is then replaced with a metal gate formed around the dielectric-filled vias.

17 Claims, 4 Drawing Sheets

FINFET GATE WITH INSULATED VIAS AND METHOD OF MAKING SAME

BACKGROUND OF THE INVENTION

1. Technical Field

The present invention generally relates to semiconductor devices and fabrication of semiconductor devices. More particularly, the present invention relates to the reducing or eliminating delamination of a metal gate of a FinFET device.

2. Background Information

The two principal approaches for forming semiconductor device gate structures have been gate-first and gate-last process approaches.

In a gate-first fabrication approach, a metal gate is provided over a gate dielectric, and then patterned and etched to form one or more gate structures. After forming the gate structures, source and drain features of the semiconductor devices are provided. In the gate-last approach, a sacrificial (or dummy) gate material is provided, patterned and etched to define one or more sacrificial gates. The one or more sacrificial gates are subsequently replaced with corresponding replacement metal gates, after source and drain features of the devices have been formed. The sacrificial gate material, such as, for example, amorphous silicon (a-Si) or polycrystalline silicon, holds the position for the subsequent metal gate to be formed. For instance, an amorphous silicon (a-Si) or polysilicon sacrificial gate material may be patterned and used during initial processing until high-temperature annealing to activate the source and drain features has been completed. Subsequently, the a-Si or polysilicon may be removed and replaced with the final metal gate.

Low resistance metal gate materials, such as tungsten, are currently employed due to advantages associated such as reduced gate contact resistance, which provide faster device performance. However, the poor adhesion between the layers during fabrication of the metal gate can have negative consequences, such as bubbling, blistering, peeling and/or delamination at the interface between the layers. Bubbling, blistering or peeling degrades the electrical contact between the layers resulting in low yield and low reliability in devices. The susceptibility of a device to the negative effects of poor adhesion between layers increases as the area of contact between poorly adhering layers increases.

Hence, there is a need to reduce or eliminate delamination of a metal gate of a FinFET device.

SUMMARY OF THE INVENTION

The shortcomings of the prior art are overcome and additional advantages are provided through the provision, in one aspect, of a method of reducing or eliminating delamination of a metal gate of a FinFET. The method includes providing an intermediate semiconductor structure of a FinFET in fabrication, the structure including a semiconductor substrate and a plurality of semiconductor fins coupled to the substrate, and forming a metal gate spanning the plurality of fins with one or more vias therethrough between the fins, the one or more vias filled with a dielectric.

In accordance with another aspect, a FinFET is provided, including a plurality of semiconductor fins coupled to the substrate, and a metal gate spanning the fins, the gate including one or more vias therethrough situated between the fins, the one or more vias being filled with a dielectric.

These, and other objects, features and advantages of this invention will become apparent from the following detailed description of the various aspects of the invention taken in conjunction with the accompanying drawings.

DETAILED DESCRIPTION OF THE INVENTION

Figure 1:
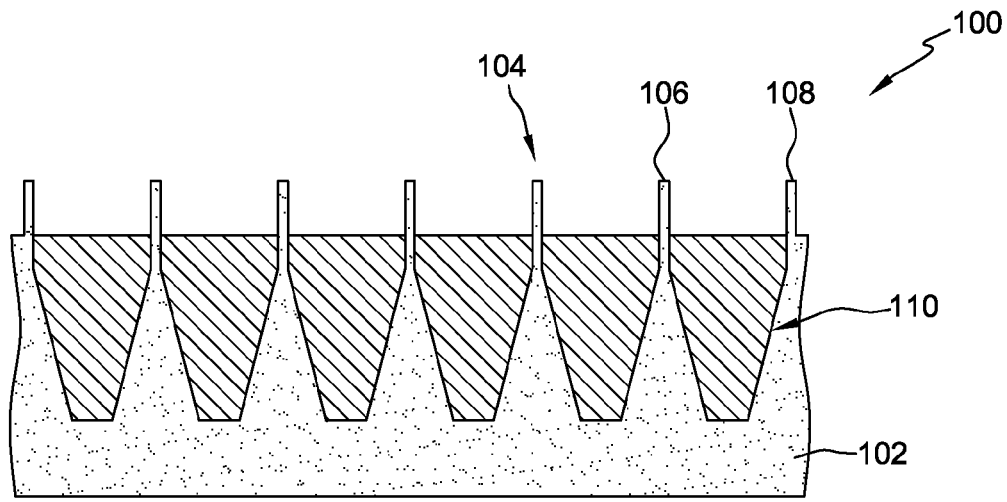
FIG. 1 is a cross-sectional elevational view of an intermediate structure of a FinFET device in fabrication, the intermediate structure including a plurality of fins disposed over a plurality of isolation features, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 illustrates a cross-sectional view of a FinFET device 100, including a substrate 102 along with a plurality of fin structures 104, e.g., fins 106 and 108, disposed above the semiconductor substrate, at an early stage of semiconductor fabrication. As one skilled in the art will know, a FinFET is a Field Effect Transistor having the source/drain/channel region situated above the substrate in one or more raised structures roughly resembling fins in some designs. A FinFET is typically on the order of tens of nanometers in width. Advantageously, the fin structure helps to control current leakage through the transistor in the off stage, and a double gate or a tri-gate structure may be employed to control short channel effects.

Returning to the cross-sectional view of the FinFET device 100 in FIG. 1, the semiconductor substrate may include, for example, silicon in a crystalline structure. The substrate may take various different forms, for example, silicon-on-nothing (SON), silicon-on-insulator (SOI) or silicon-on-replacement insulator (SRI) substrates. The substrate may in addition or instead include various isolations, dopings and/or features, to name a few examples. For example, the substrate may include other suitable elementary semiconductors, such as germanium in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, AlGaAs, GaInAs, GaInP, or GaInAsP or combinations thereof. The substrate may also include isolation regions, various doped regions, other suitable features, and/or combinations thereof.

Continuing further with FIG. 1, the fin structures 104 are laterally separated by a plurality of corresponding isolation regions 110, such as, for example, shallow isolation trenches (STI). The formation of isolation regions, such as shallow isolation trenches, may typically include, for example, forming a recess on the silicon substrate and forming a dielectric film using a CVD process, such as a low pressure CVD (LPCVD), high-density CVD (HDCVD), or plasma enhanced CVD (PECVD), then performing a chemical mechanical polish (CMP) to remove the excess dielectric film filling the shallow isolation trenches. The isolation regions 110 may be filled with dielectric materials such as, for example, tetraethyl orthosilicate (TEOS) based silicon oxide, silicon nitride and the like. The isolation regions may be annealed at a temperature of about 900° C. to about 1100° C. After the formation of the isolation regions 110, the fin structures 104 may be revealed by performing plasma etching to recess the dielectric materials in the isolation regions. Although not critical to the invention and as is known in the art, each of the fin structures 104 include areas for a source, drain and channel. It will be understood that the positioning of the source and drain areas could be switched.

Figure 2:
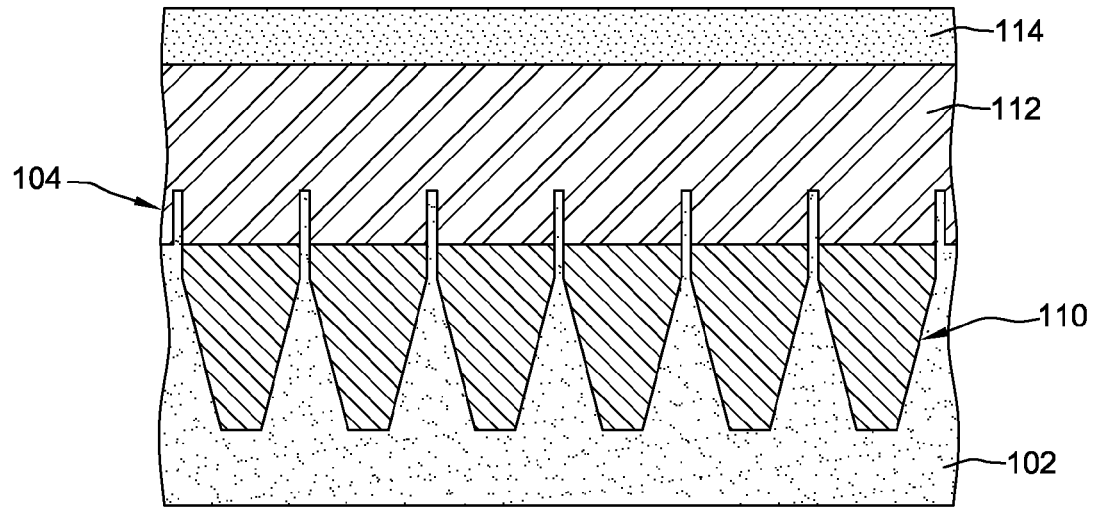
FIG. 2 depicts one example of the intermediate structure of FIG. 1, after the provision of a sacrificial gate structure and stop layer over the sacrificial gate structure, in accordance with one or more aspects of the present invention.

A sacrificial layer 112 of a dummy gate material is deposited above the plurality of isolation features 110, as depicted in FIG. 2. It may be noted that the sacrificial layer 112 may be deposited substantially perpendicular to the direction of the fin structures 104 and over a portion of the top and a portion of the side surfaces of the fin structures 104, as depicted in FIG. 2. The sacrificial layer 112 may include a material different from that of the substrate 102, so that the sacrificial layer may be selectively removed without affecting the substrate. In one example, the sacrificial layer 112 may include an amorphous-silicon (a-Si), polysilicon or polycrystalline silicon, which may be employed to hold the metal gate positions for subsequent fabrication. The sacrificial layer 112 may be deposited using conventional deposition processes such as, for example, chemical-vapor deposition (CVD), atomic layer deposition (ALD), physical vapor deposition (PVD) or plasma-enhanced versions of such processes. The thickness of the sacrificial layer may be about 50 nanometers to about 200 nanometers. A layer of stop layer 114 may be deposited over the sacrificial layer 112. In one example, the stop layer 114 may be a layer of silicon nitride with a thickness of about 20 to about 80 nanometers, having been formed via, for example, a chemical-vapor deposition (CVD) process. In one example, a silicon nitride layer may be deposited using bis-t-butylaminosilane (BT-BAS) with ammonia ($NH_3$) precursors, or dichlorosilane ($SiH_2Cl_2$) with ammonia ($NH_3$) in a CVD reactor.

As will be discussed subsequently in greater detail, the present invention seeks to reduce or eliminate delamination of the metal gate that is subsequently deposited in the fabrication process, by dividing the large surface area of the gate into smaller areas and creating separations with one or more vias or openings between the fins and further filling the one or more vias or openings with a dielectric. The present invention proceeds to pattern the stop layer and the underlying sacrificial layer having the dummy gate material and create one or more vias or openings by removing a portion of the stop layer and a portion of the underlying sacrificial layer. The one or more vias or openings may then be filled by a conformal deposition of a dielectric over the stop layer. The excess dielectric may then be removed by planarizing and the underlying stop layer may be etched to expose the sacrificial layer having the vias or openings filled with dielectric. The invention proceeds to replace the sacrificial layer of the dummy gate material with a metal gate such as, for example, tungsten, that has been partitioned by one or more vias or openings and filled with the dielectric.

Figure 3:
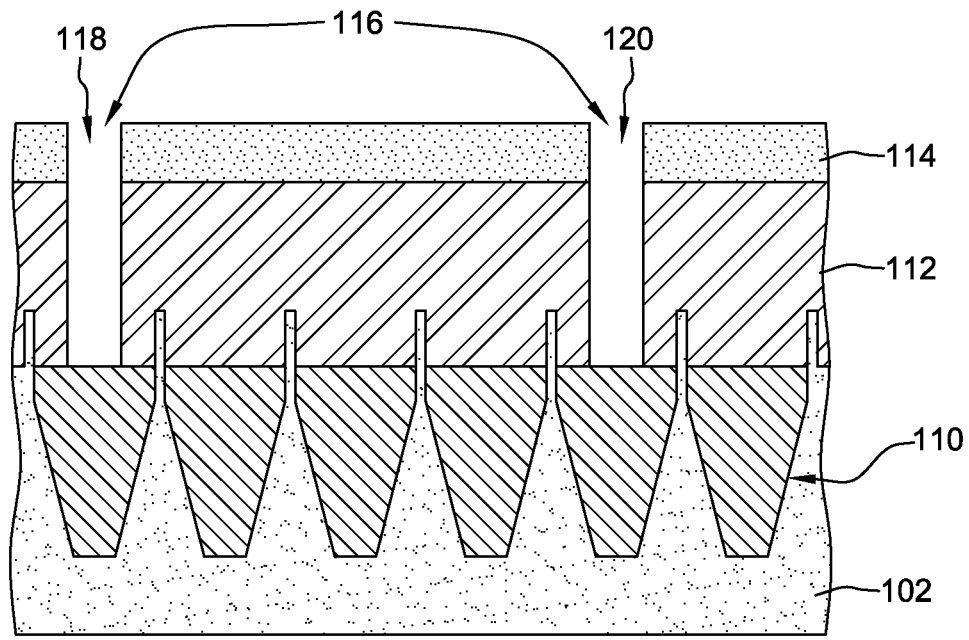
FIG. 3 depicts one example of the intermediate structure of FIG. 2, after etching a plurality of vias through the stop layer and sacrificial gate structure, in accordance with one or more aspects of the present invention.

Accordingly, as depicted in FIG. 3, the stop layer 114 is patterned with one or more vias or openings 116, e.g., vias 118 and 120, which extend through the sacrificial layer 112 of the dummy gate material to the isolation features 110. The patterning may be performed, for example, using a conventional dry-etch process, such as reactive ion etching or plasma etching. In one example, reactive ion etching may be performed using fluorine-based chemistry and involve process gases such as tetrafluoromethane ($CF_4$), trifluoromethane ($CHF_3$), difluoromethane ($CH_2F_2$), fluoromethane ($CH_3F$), octafluorocyclobutane ($C_4F_8$), hexafluoro-1,3-butadiene ($C_4F_6$) and oxygen ($O_2$).

Figure 4:
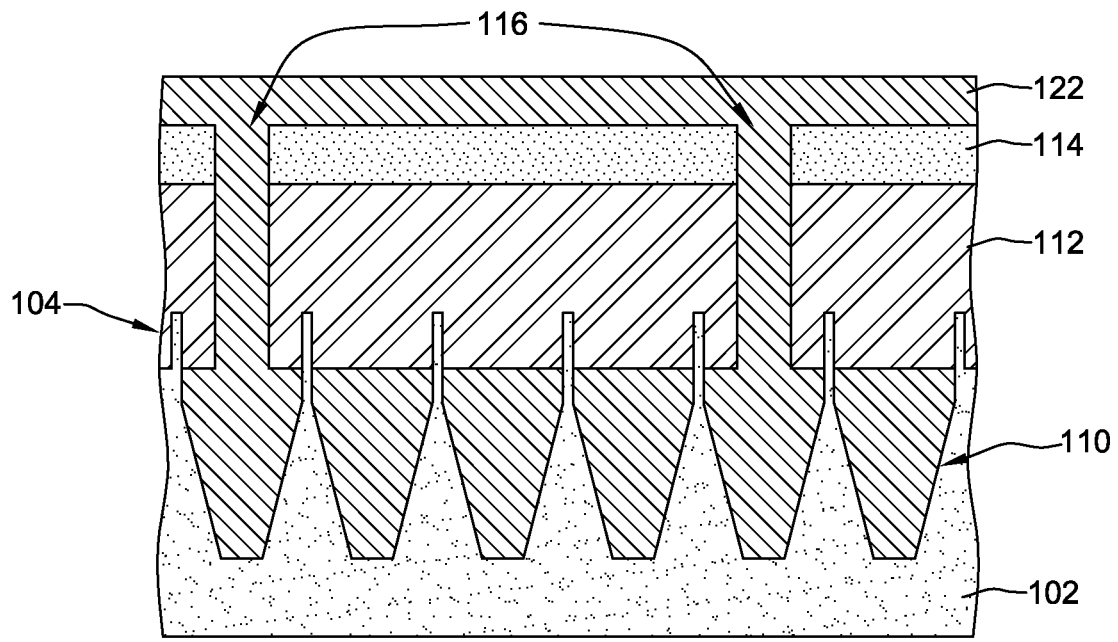
FIG. 4 depicts one example of the intermediate structure of FIG. 3, after deposition of a dielectric to fill the plurality of vias, in accordance with one or more aspects of the present invention.

As illustrated in FIG. 4, a dielectric 122 is conformally deposited above the stop layer 114 and extended into the vias or openings 116. The dielectric 122 may include a material with flow characteristics that can provide consistent fill of the via or opening, such as, for example, a flowable oxide, and is substantially different in composition from the material of sacrificial layer 112. In one example, flowable oxide may include a material, for example, flowable oxide film formed of, e.g., silicon oxide (Si—N—H—C—O or Si—N—H—O) having at least one of N, H and C as impurities, and the flowable oxide may be deposited by a flowable chemical vapor deposition (F-CVD). The thickness of the dielectric 122 above the stop layer 114 may be, for example, such as to allow for subsequent planarization. Where the material of dielectric 122 has a low density, such as, for example, flowable oxide, the dielectric 122 is preferably subjected to high temperature annealing conditions, before planarization, to allow for the densification of the dielectric. It may be noted that high temperature annealing causes the hydroxyl groups and residual carbon present in the flowable oxide to decompose into water and/or alcohol vapors, which are pumped out immediately, resulting in the densification of the dielectric. In a specific example, the flowable oxide is steam annealed in presence of oxygen.

Figure 5:
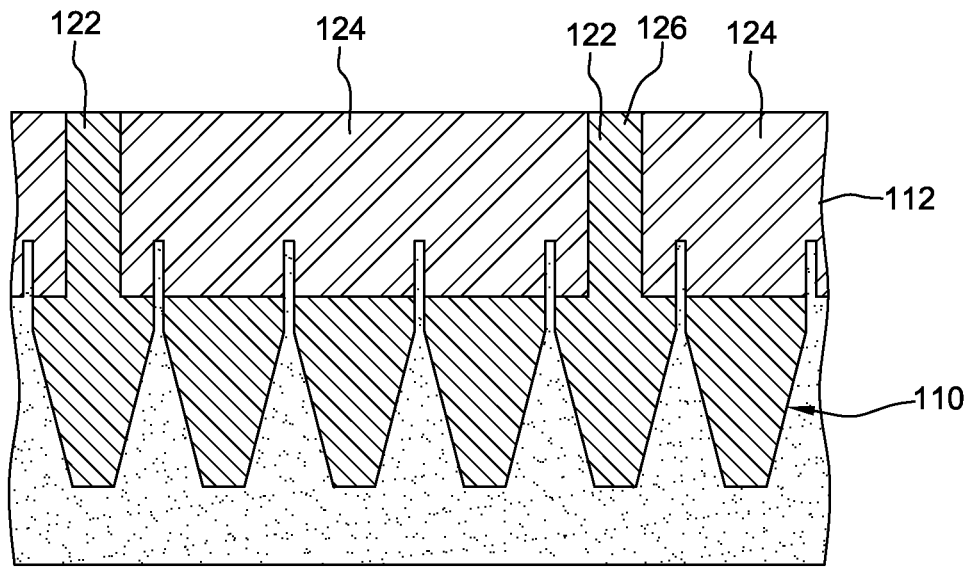
FIG. 5 depicts one example of the intermediate structure of FIG. 4, after removing excess dielectric and the underlying stop layer, in accordance with one or more aspects of the present invention.

The excess dielectric 122 has been selectively removed, as depicted in FIG. 5, using the underlying stop layer (not shown) as an etch stop. The removal of the dielectric may be performed using a conventional process such as, for example, a chemical mechanical process or a conventional etch back process. The underlying stop layer 114 may be selectively removed to expose the upper surface 124 of the sacrificial layer 112 and to create a relatively planar surface 124 with the dielectric 122 filled in the vias or openings 116. The stop layer 114 may be selectively removed using a conventional anisotropic etching process. Examples of common etching processes include dry etching processes, such as, for example, reactive ion etching, involving fluorine-based chemistry using process gases, such as, for example, tetrafluoromethane ($CF_4$), trifluoromethane ($CHF_3$), difluoromethane ($CH_2F_2$), fluoromethane ($CH_3F$), octofluorocyclobutane ($C_4F_8$), hexafluoro-1,3-butadiene ($C_4F_6$) and oxygen.

Figure 6:
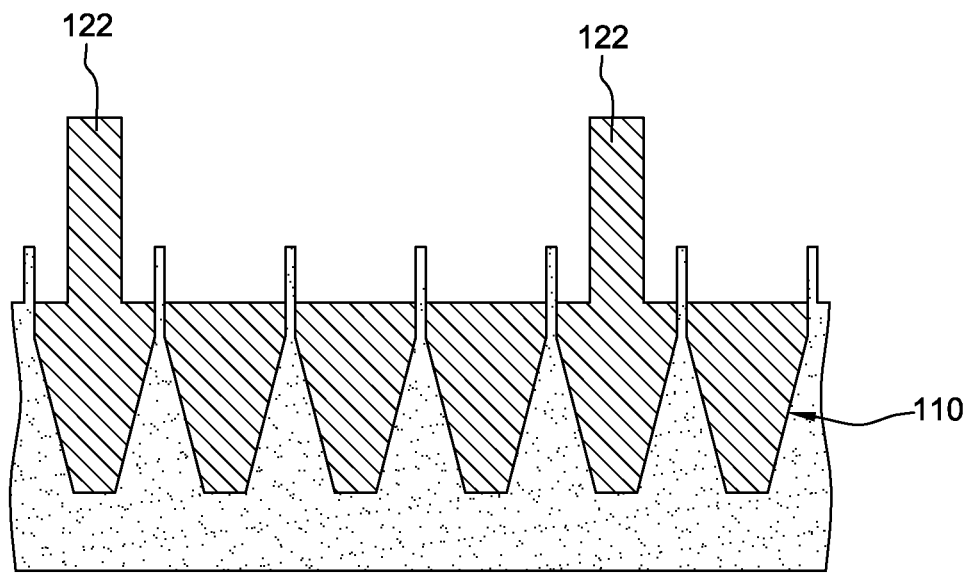
FIG. 6 depicts one example of the intermediate structure of FIG. 5, after removing the sacrificial gate structure, in accordance with one or more aspects of the present invention.

The sacrificial layer 112 of the dummy gate material is replaced with a metal gate such as, for example, tungsten, by etching the sacrificial layer. As depicted in FIG. 6, the sacrificial layer 112 may be removed, leaving the dielectric filled in the vias or openings 122. The sacrificial layer may be removed using a conventional dry etch process such as, for example, reactive ion etching or an isotropic wet etch process using etching solution such as, for example, potassium hydroxide (KOH), tetramethylammonium hydroxide (TMAH) and ethylenediamine pyrocatechol (EDP).

Figure 7:
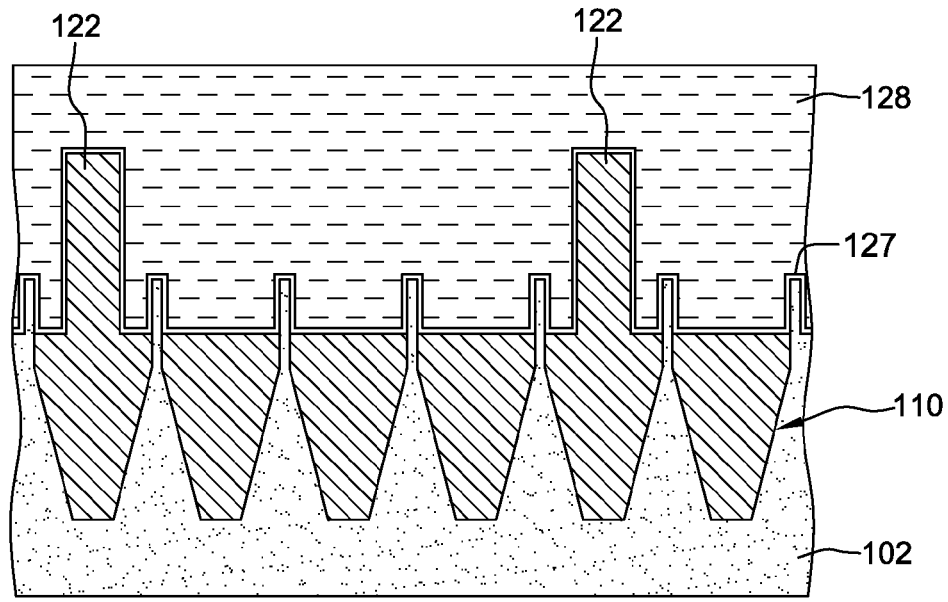
FIG. 7 depicts one example of the intermediate structure of FIG. 6, after deposition of a metal gate, in accordance with one or more aspects of the present invention.

Referring to FIG. 7 and as known in the art, that the metal gate 128 has poor adhesion to the underlying layers, the isolation regions 110 may typically be lined with one or more metal liners, such as a barrier/adhesive layer 127, prior to the deposition of metal gate such as, for example, tungsten, in the present invention. The barrier/adhesive layer 127 may be deposited by using conventional deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PE-ALD) or sputtering methods. In one example, the barrier/adhesive layer 127 may include, titanium-based materials (e.g., TiN, TiC, TiCN, TiSiN), or tantalum-based materials (e.g., TaN, TaC, TaCN, TaSiN) or fluorine-free tungsten-based materials (e.g., WN, WC, WCN, WSiN), the thickness of which may range as is used conventionally. In a specific example, tantalum nitride (TaN) may be formed by sequentially exposing the substrate to pentakis (dimethylamino) tantalum (PDMAT) and ammonia ($NH_3$) during an ALD process or a PE-ALD process.

Continuing with FIG. 7, the metal gate material 128, such as, for example, tungsten, may be deposited over the isolation regions 110. It may be noted that the metal gate 128 has been formed around and partitioned by the preexisting one or more vias or openings 122, which have previously been filled with the dielectric. The metal gate may be deposited using a conventional deposition process such as, for example, chemical vapor deposition and the thickness of the metal gate may be, for example, such as to allow subsequent planarization.

Although not shown for the clarity of the invention, the various details and layers associated with the formation of metal gate material 128, via a conventional replacement metal gate processing approach or "gate-last process" are not depicted in the drawings. For example, after the sacrificial layer has been removed, a dielectric layer followed by one or more work function layers is deposited, prior to the deposition of the metal gate material 128. The various layers deposited prior to the deposition of the metal gate material 128 may be formed from a variety of different materials using a variety of techniques, such as, for example atomic layer deposition (ALD) and chemical vapor deposition (CVD). The thickness of the gate layers may also vary, depending upon the particular application.

Figure 8:
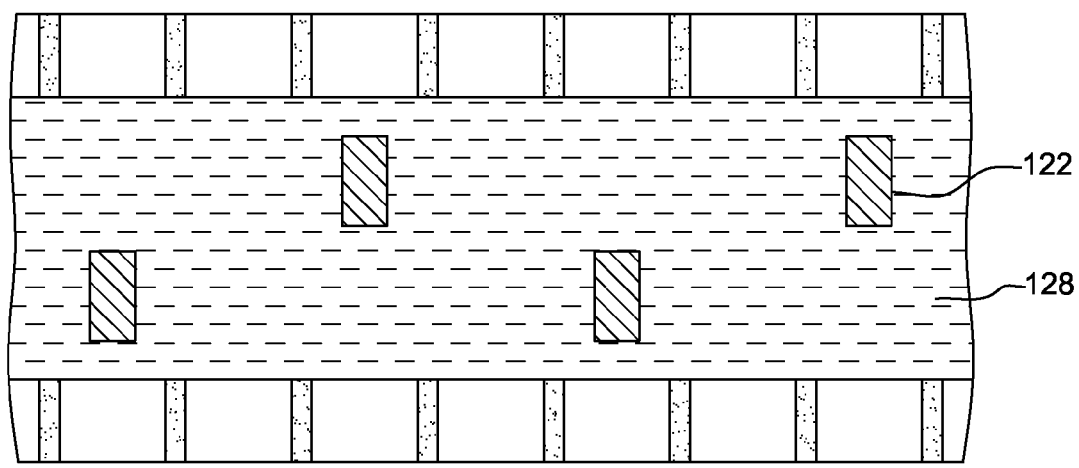
FIG. 8 depicts a top view of the resultant structure obtained after removing excess gate metal, resulting in a generally planar surface separated by the dielectric, in accordance with one or more aspects of the present invention.

FIG. 8 is a top view of the FinFET device where the large surface area of the metal gate 128 has been partitioned with one or more vias or openings 122 and the one or more vias or openings have been filled with dielectric. Advantageously, the partitioning of a metal gate with the vias or openings reduces or eliminates delamination, peeling or dishing of the metal during the planarization process performed to remove the excess gate metal, providing a uniform gate height.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing an intermediate semiconductor structure of a FinFET in fabrication, the structure comprising a semiconductor substrate and a plurality of semiconductor fins coupled to the substrate; and
   forming a metal gate spanning the plurality of fins with one or more vias therethrough between the fins, the one or more vias filled with a dielectric.

2. The method of claim 1, wherein forming the metal gate comprises:
   forming a dummy gate spanning the plurality of fins;
   removing one or more areas of the dummy gate between the fins to create one or more vias therein;
   filling the one or more vias with a dielectric; and
   replacing the dummy gate with a metal gate.

3. The method of claim 2, wherein the structure further comprises a stop layer over the dummy gate, wherein the one or more vias extend through the stop layer, and wherein the filling leaves excess dielectric over the stop layer, and wherein forming the metal gate further comprising removing excess dielectric and stopping at the stop layer.

4. The method of claim 2, wherein the replacing comprises:
   removing the dummy gate while leaving the dielectric from the vias; and
   forming the metal gate around the dielectric.

5. The method of claim 4, wherein the forming comprises forming a tungsten gate around the dielectric.

6. The method of claim 4, wherein the replacing further comprises, prior to forming the metal gate and after removing the dummy gate, depositing a liner for the metal gate.

7. The method of claim 1, wherein the dielectric comprises an oxide.

8. The method of claim 7, wherein the oxide comprises a flowable oxide.

9. The method of claim 1, wherein the metal gate comprises tungsten.

10. A method of fabricating a FinFET, the method comprising:
    providing an intermediate semiconductor structure of a FinFET in fabrication, the structure comprising a semiconductor substrate and a plurality of semiconductor fins coupled to the substrate; and
    forming a metal gate spanning the plurality of fins with one or more vias therethrough between the fins, the one or more vias filled with a dielectric;
    wherein the providing and the forming create a FinFET, the FinFET comprising:
      a semiconductor substrate;
      a plurality of semiconductor fins coupled to the substrate; and
      a metal gate spanning the fins, the gate comprising one or more vias therethrough situated between the fins, the one or more vias being filled with a dielectric.

11. A FinFET, comprising:
    a semiconductor substrate;
    a plurality of semiconductor fins coupled to the substrate; and
    a metal gate spanning the fins, the gate comprising one or more vias therethrough situated between the fins, the one or more vias being filled with a dielectric.

12. The FinFET of claim 11, further comprising a dielectric between the fins, wherein the dielectric between the fins matches the dielectric in the one or more vias.

13. The FinFET of claim 11, wherein the metal gate comprises tungsten, and wherein the dielectric comprises an oxide.

14. The FinFET of claim 13, wherein the oxide comprises a flowable oxide.

15. The FinFET of claim 13, wherein the semiconductor substrate and the plurality of semiconductor fins comprise silicon, and wherein the dielectric comprises silicon dioxide.

16. The FinFET of claim 11, further comprising a liner directly under the metal gate.

17. The FinFET of claim 16, wherein the liner comprises titanium nitride, and wherein the metal gate comprises tungsten.

* * * * *